United States Patent
Duva

[19]

[11] Patent Number: 6,104,598

[45] Date of Patent: Aug. 15, 2000

[54] FREE FORM CAPACITOR

[75] Inventor: Frank A. Duva, Carlsbad, Calif.

[73] Assignee: Delaware Capital Formation, Inc., Wilmington, Del.

[21] Appl. No.: 09/362,258

[22] Filed: Jul. 28, 1999

[51] Int. Cl.[7] .............................. H01G 4/005; H01G 4/06
[52] U.S. Cl. .................. 361/303; 361/321.2; 361/306.3; 29/25.42
[58] Field of Search ..................................... 361/280, 803, 361/288, 303, 306.3, 311–313, 321.1–321.5; 719/535; 338/195; 29/25.41, 25.42

[56] References Cited

U.S. PATENT DOCUMENTS

| | | | |
|---|---|---|---|
| 3,740,624 | 6/1973 | McAdams, Jr. et al. | 361/321.2 |
| 4,423,464 | 12/1983 | Tamura et al. | 361/288 |
| 4,510,556 | 4/1985 | Johnson | 362/184 |
| 4,792,779 | 12/1988 | Pond et al. | 338/195 |
| 4,831,494 | 5/1989 | Arnold et al. | 361/306.3 |
| 4,870,538 | 9/1989 | Baldwin et al. | 361/321 |
| 5,350,637 | 9/1994 | Ketcham et al. | 428/539 |
| 5,557,495 | 9/1996 | Belcher et al. | 361/298.2 |
| 5,818,683 | 10/1998 | Fuji | 361/277 |
| 5,949,657 | 9/1999 | Karabastsos | 361/803 |

Primary Examiner—Dean A. Reichard
Assistant Examiner—Anthony Dinkins
Attorney, Agent, or Firm—Christie, Parker & Hale, LLP

[57] ABSTRACT

A variable, free form shaped capacitor structure formed by casting tape on a belt casting machine, screen printing the tape with thick film metal ink, pressing and curing the printed tape stack, laminating the printed stack, and cutting a free form nonsymmetrical capacitor outline based on the shape of the item in which the capacitor will be stored. The free form capacitor can be cut using a variety of cutting devices, including, a routing machine, a razor blade, a water jet, or a laser. The outline can have any shape, including straight lines, angles, convex or concave geometry. Additionally, the various geometrical shapes can exist simultaneously within the same capacitor structure. Upon achievement of the desired shape, ceramic sintering is performed to form a single monolithic capacitor structure.

9 Claims, 2 Drawing Sheets

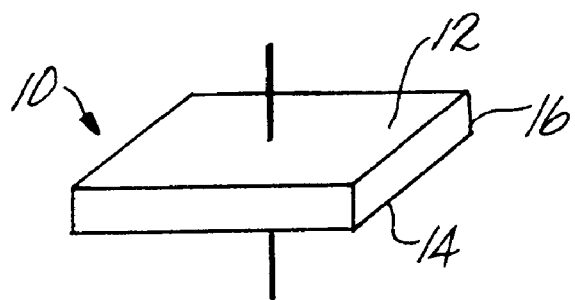
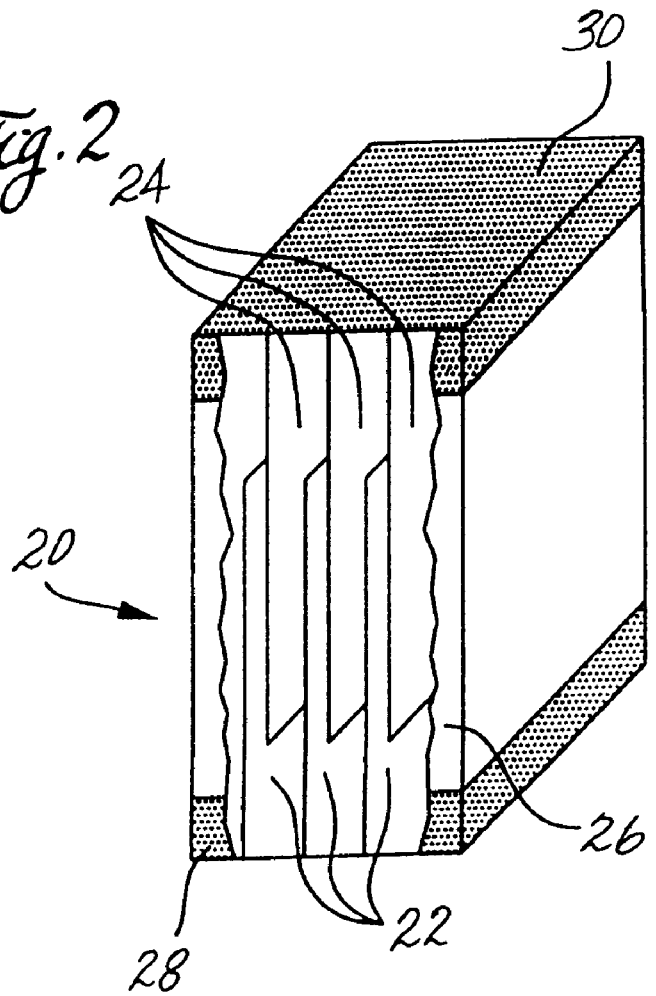

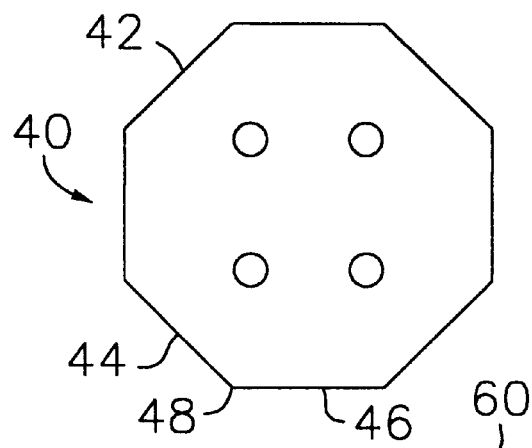
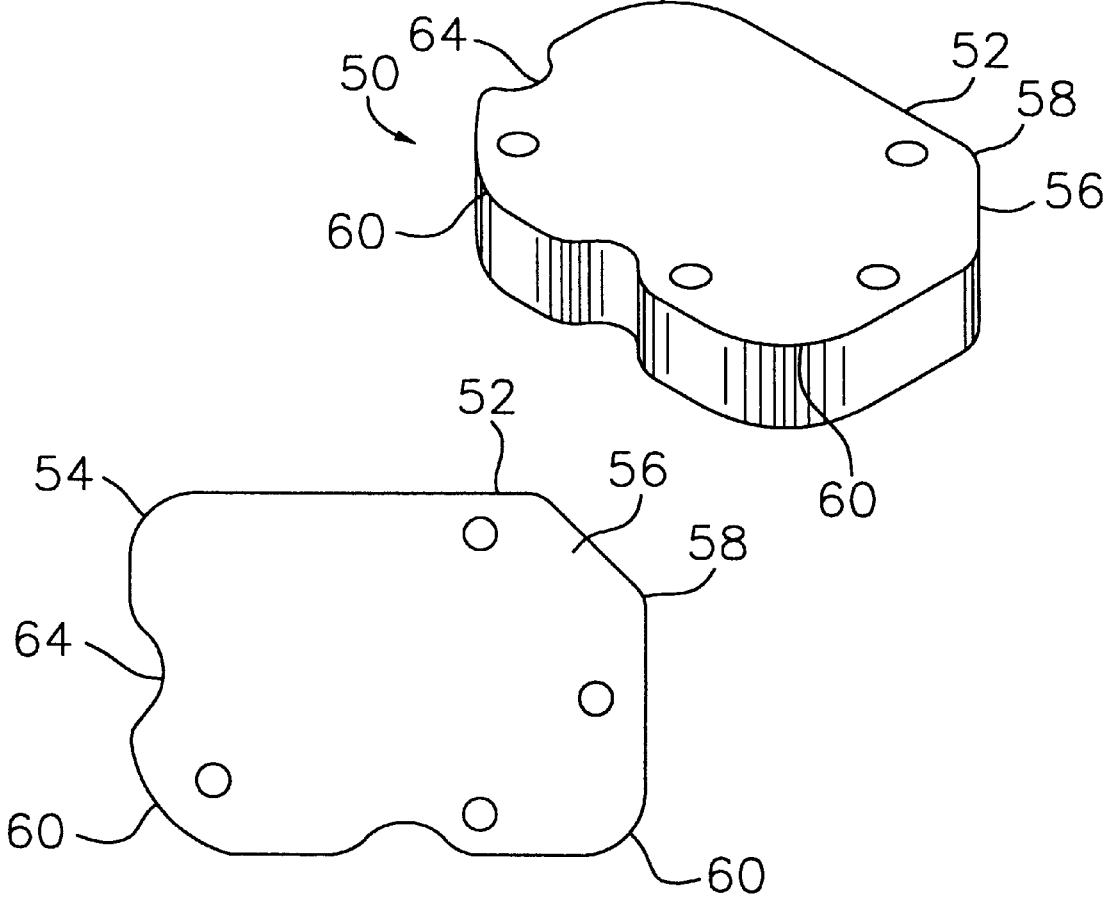

FREE FORM CAPACITOR

BACKGROUND OF THE INVENTION

The present invention relates to monolithic ceramic capacitors mountable on electronic circuit boards. More specifically, the invention concerns ceramic chip capacitors of a variable, free form shape composed of multi layer polycrystalline ceramic and metal composites and the method of making these capacitors.

The basic model of a capacitor, as shown in FIG. 1, is a single plate device 10 consisting of two electrodes 12, 14 insulated from each other by dielectric material 16. FIG. 2 illustrates a basic monolithic ceramic chip capacitor 20. According to known technique, a monolithic ceramic capacitor 20 is manufactured by interleaving electrode layers 22, 24 and dielectric layers 26, compressing all layers, and sintering the layers to form a solid monolithic block.

The principal characteristic of a capacitor is that it is capable of storing electric charge, and this feature is useful in a variety of applications, including, discharge of stored energy, blockage of direct current, coupling of circuit components, by-passing of an AC signal, frequency discrimination and transient voltage and arc suppression. A capacitor's ability to store electric charge is directly proportional to the capacitance value of the capacitor and the voltage applied to it. Accordingly, to optimize the performance of a capacitor, it is desirable to maximize the capacitor's capacitance value.

For any given voltage, the capacitance value of a device is directly proportional to the area and inversely proportional to the thickness, this relationship is expressed as $$C=K(A/d)$$

where:

C is capacitance

K is Constant dependent on the medium between the two conductors

A is area d is thickness.

As is evident by the relationship stated above, greater capacitance value can be achieved either by increasing the electrode area or choosing a dielectric material with a high relative permittivity.

In general, capacitors can utilize a variety of dielectrics such as gas (or vacuum), naturally occurring elements (e.g., mica) or prepared materials (e.g., ceramics). Chip capacitors usually utilize ceramic dielectric materials based on the titanates or niobates. The most common dielectric is barium titanate. Numerous attempts have been made to optimize the electrical properties of these dielectric materials by developing new processes and materials. These efforts, however, are costly and time consuming.

An alternative method of optimizing a capacitor's value is to increase the area of the capacitor. Traditionally, chip capacitors used for surface mounting on electronic circuits have been rectangular in shape. Some attempts have been made to create disk-shaped, crown-shaped or honeycomb-shaped capacitors. These capacitors, however, are costly and difficult to manufacture. Consequently, due to the ease of manufacturability, most capacitors are limited to a rectangular, square or circular shape.

SUMMARY OF THE INVENTION

It is an object of the present invention to provide a free form capacitor that will maximize the capacitance value without requiring a change of the materials used in the capacitor.

It is a further object of the present invention to make efficient usage of any available area in which a capacitor will be stored.

It is yet a further object of the present invention to provide a free form capacitor that will be able to conform to the shape of any area and will be able to accommodate any obstacles within that area.

The present invention addresses the problems with the prior art techniques. A free form capacitor is formed by casting tape on a belt casting machine, screen printing the tape with thick film metal ink, and pressing and curing the printed tape stack. The printed stack is then laminated. If it is required by the particular application, internal electrode contact holes can be drilled with a visual recognition drill or route machine. The number of holes and the size of each hole will vary depending on the application of the capacitor. A free form nonsymmetrical capacitor outline is carved using a cutting device. The cutting device could be a routing or drill machine, a razor blade, a laser, a water jet or any similar device capable of forming the outline of the capacitor. The shape of the capacitor is chosen with reference to the item in which the capacitor will be located. The outline of the free form capacitor can comprise of any geometrical shape, including straight lines, angles, convex or concave geometry. Additionally, the various geometrical shapes can exist simultaneously within the same capacitor. After the desired shape is achieved, an organic burn-out is performed.

The surface of the capacitor is cleaned and the corners can be rounded. Ceramic firing or sintering is performed to form the layers into a solid block. If necessary, metallization of holes, sides and surface areas is completed followed by the metallization firing. The application of the metallization is dependent on the efficiency and capability requirements of the particular application.

The free form capacitor of the present invention maximizes the capacitance by making optimal use of the available space. The more area that can be utilized, the higher the capacitance of the improvement over existing product capability. This improvement is much more cost effective than the development of new materials that yield a higher rate of relative permittivity.

The space utilization of the free form capacitor of the present invention results in a higher capacitance value by maximizing the usage of any available area. Additionally, the capacitor can conform to any shape and can form around obstacles within that area.

DESCRIPTION OF THE DRAWINGS

Other objects and advantages of the invention will become apparent upon reading the following detailed description and upon reference to the drawings in which:

FIG. 1 is a perspective view of a basic model of a capacitor;

FIG. 2 is a perspective view of an exemplary discrete multi-layered chip capacitor and shown in cross-section to reveal interleaved capacitor plates embedded in ceramic dielectric material;

FIG. 3 is a top view of an exemplary chip capacitor of the present invention having an octagonal shape;

FIG. 4 is a perspective view of another exemplary chip capacitor of the present invention having a variable, free form shape; and FIG. 5 is a top view of the chip capacitor of the present invention embodied in FIG. 4.

DETAILED DESCRIPTION OF THE INVENTION

A typical rectangular multi-layer chip capacitor 20 is shown in FIG. 2. The capacitor 20 is shown partially broken away to reveal interleaved electrode layers 22 and 24 embedded in ceramic dielectric material 26 and alternately connected to upper and lower terminations 28 and 30. It is to be understood that the type of capacitor plates, dielectric material and terminations are selected according to the specific specifications for its application. Chip capacitors usually utilize ceramic dielectric materials based on the titanates or niobates. Capacitor plates and terminations can be manufactured from silver, silver—palladium, nickel, or gold. The exemplary embodiment of the present invention can be of the same construction as the capacitor of FIG. 2.

The capacitor shown is suitable for surface mounting on a printed circuit board. Alternatively, the invention also contemplates capacitors utilized within a circuit board other than in a surface mounted fashion. Although FIG. 2 illustrates a single capacitor, the invention could be utilized with monolithic structures containing a plurality of capacitors.

FIGS. 3, 4 and 5 illustrate free form capacitors having various shapes. FIG. 3 shows a capacitor 40 having an octagonal shape. Each capacitor side 42 has a straight line configuration. Each pair of adjoining sides 44 and 46 converge at an angle and meet at a point 48.

FIGS. 4 and 5 illustrates another embodiment of the present invention. Referring now to FIGS. 4 and 5, capacitor 50 comprises a front portion 52 and a back portion 54. The front portion 52 has a straight edge 56 that is similar to the straight line configuration of side 42 of capacitor 40 in FIG. 3. Straight line 56 defines a cut-away corner 58. The cut-away corner allows capacitor 50 to utilize a larger space while still allowing room in the corner for any obstacles that may be present. A traditional rectangular capacitor does not have a cut-away corner and can only accommodate the obstacle by shortening the entire front portion of the capacitor. As a result of the cut-away corner design, capacitor 50 is able to utilize more space than the traditional rectangular capacitor. Accordingly, capacitor 50 has a higher capacitance than a rectangular capacitor of the same material composition. By maximizing the utilization of the available space, a capacitor in accordance with the present invention optimizes performance in an easy, cost-effective manner.

Capacitor 50 also comprises a plurality of rounded corners 60. The radii of curvature of each of the rounded corners 60 can be chosen such that capacitor 50 uses the maximum space available to it. There is no requirement that the radius of curvature of each of the rounded corners 60 be of the same value. The varying radii of curvature enables the capacitor to fit into a variety of locations, including nonsymmetrical, free-form-shaped enclosures.

The back portion 54 of capacitor 50 defines a concave indentation 64. Indentation 64 allows capacitor 50 to form around any obstacles existing in the area occupied by the capacitor. Additionally, if the board on which the capacitor to be mounted requires ventilation, indentation 64 can allow for the circulation of air. The size and shape of the indentation can vary depending on the obstacle to be overcome or the amount of ventilation required. There can be as many indentations as necessary. The shapes described herein are exemplary. The embodiments can be modified to include any combination of desired shapes and sizes.

The process for manufacturing the free form capacitor of the present invention comprises the steps of casting tape on a belt casting machine, screen printing the tape with thick film metal ink, and pressing and curing the printed tape stack. These manufacturing steps are performed in accordance with known techniques. Screen printing is the known method of printing in which ink is forced through a stencil screen. Commonly used screens consist of a photosensitive film over a finely woven stainless steel screen. The stencil can be formed by a photographic process similar to that used in a photo etching process.

The printed stack is then laminated using known lamination techniques. If it is required for the specific application, internal electrode contact holes can be drilled with a visual recognition drill or route machine. The number of holes and the size of each hole will vary depending on the application of the capacitor. A free form nonsymmetrical capacitor outline is carved using a cutting device. The cutting device could be a routing or drill machine, a razor blade, a laser, a water jet or any similar device capable of forming the outline of the capacitor. The shape of the capacitor is chosen with reference to the item in which the capacitor will be located. The outline of the free form capacitor can comprise of any geometrical shape, including straight lines, angles, convex or concave geometry. Additionally, the various geometrical shapes can exist simultaneously within the same capacitor. Some examples of the various geometric shape are illustrated in FIGS. 3, 4 and 5. After the desired shape is achieved, an organic burn-out is performed in accordance with well known techniques.

The surface of the capacitor is cleaned and the corners are rounded using an abrasive method. The rounded corners prolong the resilience of the capacitor by protecting against chips. Capacitors with sharp edges tend to chip more frequently. Ceramic firing or sintering is performed to form the layers into a solid block. If necessary, metallization of holes, sides and surface areas is completed followed by the metallization firing. The necessity of the metallization depends upon the efficiency and capability requirements of the product application. The sintering, metallization, and metallization firing processes can be performed in accordance with procedures well-known in the art. Any required electrical, mechanical or visual testing can be performed at this point.

The present invention could be utilized with monolithic structures containing a plurality of capacitors. The capacitor cutting device is used in the same manner described above to create a free form nonsymmetrical outline based on the shape of the item in which the structure will be stored. Like the single capacitor structure, the routing of the multi-capacitor structures can comprise of any geometrical shape, including straight lines, angles, convex or concave geometry.

While the invention is disclosed in conjunction with specific embodiments thereof, it is to be evident that many alternatives, modifications, and variations will be apparent to those skilled in the art in light of the foregoing description. Accordingly, it is intended to embrace all such alternatives, modifications and variations as falling within the spirit and broad scope of the appended claims.

What is claimed is:

1. A capacitor structure comprising:

at least a pair of electrodes, each electrode having a variable, free-form shape; and a dielectric layer disposed between the electrodes, the dielectric layer having a variable, free-form shape.

2. The capacitor structure of claim 1, wherein said shape is formed by a cutting device.

3. The capacitor structure of claim 2, wherein said cutting device comprises a routing machine.

4. The capacitor structure of claim 2 wherein said cutting device comprises a razor blade.

5. The capacitor structure of claim 2 wherein said cutting device comprises a laser.

6. The capacitor structure of claim 2 wherein said cutting device comprises a water jet.

7. A capacitor structure comprising:

at least a pair of electrodes, each electrode having a variable, free-form shape;

a dielectric layer disposed between the electrodes, the dielectric layer having a variable, free-form shape; and wherein the electrodes and the dielectric layer each have at least one curved corner.

8. The capacitor structure of claim 7 wherein the electrodes and the dielectric layer each includes a concave section.

9. The capacitor structure of claim 7 wherein the electrodes and the dielectric layer each includes a convex section.

* * * * *